United States Patent
Hotta et al.

(10) Patent No.: US 6,890,788 B2
(45) Date of Patent: May 10, 2005

(54) MANUFACTURING METHOD OF A MICRO STRUCTURE

(75) Inventors: Hiroyuki Hotta, Ebina (JP); Takayuki Yamada, Ebina (JP); Mutsuya Takahashi, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/793,906

(22) Filed: Mar. 8, 2004

(65) Prior Publication Data

US 2005/0020005 A1 Jan. 27, 2005

(30) Foreign Application Priority Data

Jul. 22, 2003 (JP) ........................................ 2003-277815

(51) Int. Cl.[7] .............................................. H01L 21/00
(52) U.S. Cl. ........................................ 438/52; 438/458
(58) Field of Search ............................ 438/52, 53, 458, 438/459, 464

(56) References Cited

U.S. PATENT DOCUMENTS 6,506,620 B1 * 1/2003 Scharf et al. ................ 438/52
6,790,699 B2 * 9/2004 Vossenberg et al. .......... 438/50
2002/0197761 A1 * 12/2002 Patel et al. ................... 438/52
2003/0054588 A1 * 3/2003 Patel et al. ................. 438/107

FOREIGN PATENT DOCUMENTS

JP    A 11-28768      2/1999
JP    A 2000-238000   9/2000

* cited by examiner

*Primary Examiner*—Chandra Chaudhari
(74) *Attorney, Agent, or Firm*—Oliff & Berridge, PLC

(57) ABSTRACT

A release layer is formed on a substrate, and plural thin-film patterns are formed on the release layer. The release layer is etched back at a prescribed depth at least in regions close to the circumferences of the thin-film patterns. The thin-film patterns are transferred sequentially to a counter substrate to be laminated on the counter substrate and to thereby form a micro structure. This manufacturing method is employed in a case that the combination of thin-film patterns and are lease layer is such that when a prescribed pressure is applied to each of the thin-film patterns on the release layer in the transferring, the height of a raised portion of the release layer that would be appeared in a region close to the circumference of the thin-film pattern if the release layer were not be etched back is greater than or equal to the thickness of the thin-film pattern.

7 Claims, 10 Drawing Sheets

MANUFACTURING METHOD OF A MICRO STRUCTURE

BACKGROUND OF THE INVENTION

1. Field of the Invention

The present invention relates to a manufacturing method of a micro structure such as a micro gear or a microscopic optical component manufactured by a laminated formation method or a die for molding of such a component. In particular, the invention relates to a manufacturing method of a micro structure capable of laminating very thin films at a high transfer rate.

2. Description of the Related Art

In recent years, the laminated formation method has spread rapidly as a method for forming a computer-designed three-dimensional object having complex shape in a short period (i.e., a period short enough to meet an early appointed date of delivery). Three-dimensional objects formed by the laminated formation method are used as models (prototypes) of components of various apparatus to check whether their operations and shapes are proper. In the past, in many cases, components to which this method were applied were of relatively large sizes, that is, on the order of centimeters or larger. However, in recent years, there has occurred demand for application of this method to micro parts produced by the precision machining such as micro gears and microscopic optical components. Prior art references relating to this technology are JP-A-2000-238000 (patent document-1) and JP-A-11-28768 (patent document-2).

FIGS. 7A–7C to FIGS. 9A and 9B show a manufacturing method of a micro structure that is described in patent document-1. First, as shown in FIG. 7A, a silicon wafer as a substrate 101 is prepared and a polyimide release layer 102 is formed on the surface of the substrate 101 at a thickness of 2 to 5 μm by spin coating.

Then, as shown in FIG. 7B, an 8-μm-thick Al thin film 103 is deposited on the release layer 102 by sputtering and a resist 104 is formed thereon. After a photolithography step, as shown in FIG. 7C the Al thin film 103 is etched into plural thin-film patterns 105a, 105b, and 105c having partial sectional shapes of a desired micro structure. A resulting substrate is called a donor substrate 106.

Then, as shown in FIG. 8, the donor substrate 106 is fixed to an xyθ stage 107 that is provided in a vacuum chamber 110 and can be moved in the x-axis and y-axis directions and rotated about the z axis (i.e., in the θ direction). A target substrate 109 is fixed to a z stage 108 that can be moved in the z-axis direction. Then, FABs (fast atom beams) that are Ar neutral beams are emitted from particle beam emission ends 111 and 112 and applied to the surfaces of the donor substrate 106 on the xyθ stage 107 and the target substrate 109 on the z stage 108, whereby oxide films, impurities, etc. on the surface of the donor substrate 106 and the target substrate 109 are removed to produce clean surfaces.

Subsequently, as shown in FIG. 9A, the surface of the target substrate 109 is brought into contact with the surface of the first thin-film pattern 105a and pressed against it with a load of 50 kgf/cm² for 5 minutes, whereby the target substrate 109 and the first thin-film pattern 105a are joined to each other strongly.

Then, as shown in FIG. 9B, the z stage 108 is elevated. Since the joining of the target substrate 109 and the first thin-film pattern 105a is stronger than the adhesion between the first thin-film pattern 105a and the release layer 102 on the donor substrate 106, the first thin-film pattern 105a is transferred from the donor substrate 106 to the target substrate 109.

Then, the xyθ stage 107 is moved by a prescribed pitch and positioning, FAB illumination, and transfer steps are repeatedly executed for the second thin-film pattern 105b and then for the third thin-film pattern 105c in the same manner as done for the first thin-film substrate 105a as shown in FIGS. 8, 9A and 9B, whereby a micro structure is completed. Then, the target substrate 109 is removed from the z stage 108 and the necessary micro structure is separated from the target substrate 109.

The conventional manufacturing method of a micro structure described in patent document-2 is as follows. A release layer is formed on a substrate and plural thin-film patterns having prescribed two-dimensional patterns are formed on the release layer. The release layer is etched back at a prescribed depth to form recesses. The thin-film patterns are peeled off the release layer and laminated (joined together) on a stage, whereby a micro structure is obtained. With this manufacturing method, even if particles such as fragments of glass or an Si wafer as a substrate, peeled pieces of metal, or a fine powder exist between the substrate and the stage, the surface contact between the state and the thin-film patterns is not obstructed.

However, in the conventional manufacturing method of patent document-1, if a thin-film pattern 105 is too thin, the thin film pattern 105 is buried in the release layer 102 and the top surfaces of the thin-film pattern 105 and the release layer 102 are made flush with the bottom surface of the target substrate 109. A load from the target substrate 109 is imposed uniformly on the thin-film pattern 105 and the release layer 102. Contrary to the intention of applying a load to the thin-film pattern 105 to join and transfer the thin-film pattern 105 to the target substrate 109, as shown in FIG. 10 a portion of the release layer 102 is raised in a region close to the circumference of the thin-film pattern 105 and the top surface of the raised portion 102a becomes flush with that of the thin-film pattern 105. The load imposed on the thin-film pattern 105 becomes insufficient, resulting in insufficient joining and transfer.

On the other hand, in the conventional manufacturing method of patent document-2, although the release layer is etched back, the etch-back is performed to decrease the transfer yield reduction due to particles. Therefore, the conditions relating to the thicknesses of the thin-film patterns and the release layer are different from the conditions of the problem to be solved by the invention. Therefore, this manufacturing method cannot solve the problem that arises when the height of a raised portion of the release layer in a region close to the circumference of a thin-film pattern is greater than or equal to the thickness of the thin-film pattern in the transfer step.

SUMMARY OF THE INVENTION

The present invention has been made in view of the above circumstances, and provides a manufacturing method of a micro structure capable of laminating very thin films at a high transfer rate.

The invention provides a manufacturing method of a micro structure including the steps of forming a release layer on a substrate; forming the plural thin-film patterns having prescribed two-dimensional patterns on the release layer; etching back the release layer at a prescribed depth at least in regions close to circumferences of the thin-film patterns; and transferring the thin-film patterns sequentially to a counter substrate so that they are laminated on the counter substrate and a micro structure is thereby formed, wherein a combination of the thin-film patterns and the release layer is such that when a prescribed pressure is applied to each of the thin-film patterns on the release layer in the transferring step, a height of a raised portion of the release layer that would be appeared in a region close to a circumference of the thin-film pattern if the release layer were not be etched back is greater than or equal to a thickness of the thin-film pattern.

With the above method, since the release layer is etched back at least in the regions close to the circumferences of the thin-film patterns, even if a portion of the release layer is raised in the transfer step the raised portion can be prevented from contacting the counter substrate or a thin-film pattern that has been transferred to the counter substrate. A prescribed pressure can be exerted on the entire surface of the thin-film pattern.

That is, according to the manufacturing method of a micro structure according to the invention, even if a portion of the release layer is raised in the transfer step, the raised portion is prevented from contacting the counter substrate or a thin-film pattern that has been transferred to the counter substrate. Therefore, the thin-film patterns can be transferred in such a manner that a sufficient load is imposed thereon reliably. This makes it possible to laminate thin films at a high transfer rate. Further, since a very thin film can be used, the resolution in the lamination direction can be increased.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1A:
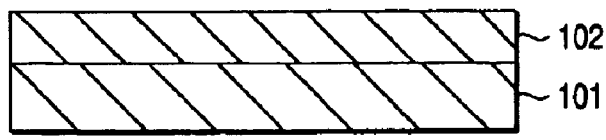
FIGS. 1A–1E are sectional views showing a manufacturing method of a micro structure according to a first embodiment of the invention.

FIGS. 1A–1E to 4 show a manufacturing method of a micro structure according to a first embodiment of the present invention. First, as shown in FIG. 1A, an Si wafer as a substrate 101 is prepared and a release layer 102 made of polyimide (polyimide PIX3400 of Hitachi Chemical Co., Ltd.) is formed on the substrate 101 by spin coating at a thickness (e.g., 2 $\mu$m) that is thicker than an Al thin film that will be formed in a later step.

Figure 1B:
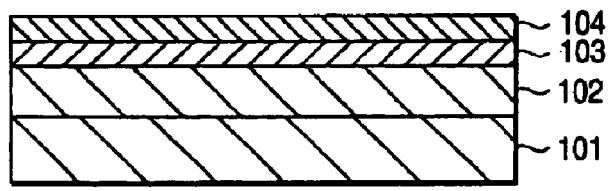
Figure 1C:
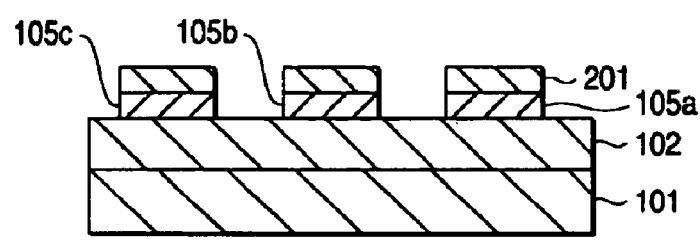

Then, as shown in FIG. 1B, a very thin Al thin film 103 is deposited on the release layer 102 by sputtering at a thickness (e.g., 0.17 $\mu$m) that is smaller than 1 $\mu$m and a resist 104 is formed thereon. After a photolithography step, as shown in FIG. 1C the Al thin film 103 is etched into plural thin-film patterns 105a, 105b, and 105c having partial sectional shapes of a desired micro structure.

Figure 1D:
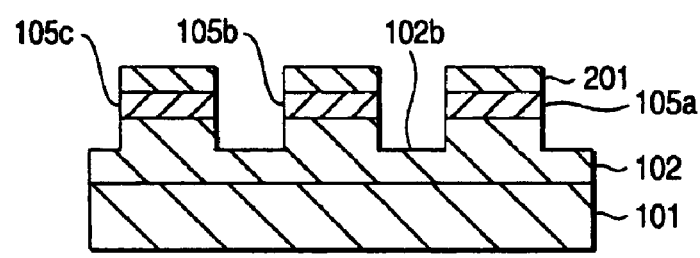

Then, as shown in FIG. 1D, etching is performed in, for example, regions where the release layer 102 is exposed, whereby recesses 102b having a prescribed depth are formed. The etching may be wet etching in which the substrate is immersed in a liquid for a prescribed time and dry etching that is performed in a vacuum apparatus. FIG. 1D shows a case of dry etching. With the dry etching, etching surfaces are formed almost perpendicularly to the substrate. On the other hand, in the case of wet etching, the side etching proceeds to under the bottom surfaces of the thin-film patterns 105a, 105b, and 105c and a sufficient load may not be imposed on the thin-film patterns 105a, 105b, and 105c in a transfer step. However, the wet etching can well be used depending on the shape accuracy that is required for the thin-film patterns 105a, 105b, and 105c.

A mixed gas of $CF_4$ and $O_2$ is typically used as a gas for etching back the release layer 102. Since the gas etches such a metal as Al of which the thin-film patterns 105a, 105b, and 105c are made at a sufficiently low etching rate, it can be said that there is no influence on the surfaces of thin-film patterns 105a, 105b, and 105c. If this etch-back step is executed by dry etching in a state that the resist patterns 201 exist, not only is the polyimide release layer 102 etched back but also the thickness of the resist patterns 201 are decreased. However, there is no influence on the surfaces of thin-film patterns 105a, 105b, and 105c because they are not etched. The etch-back may be performed by using the thin-film patterns 105a, 105b, and 105c as a mask after removing the resist patterns 201.

Figure 1E:
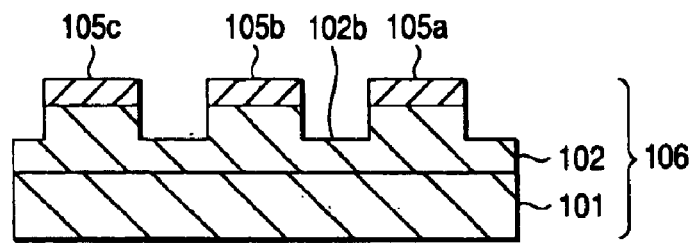
Figure 2:
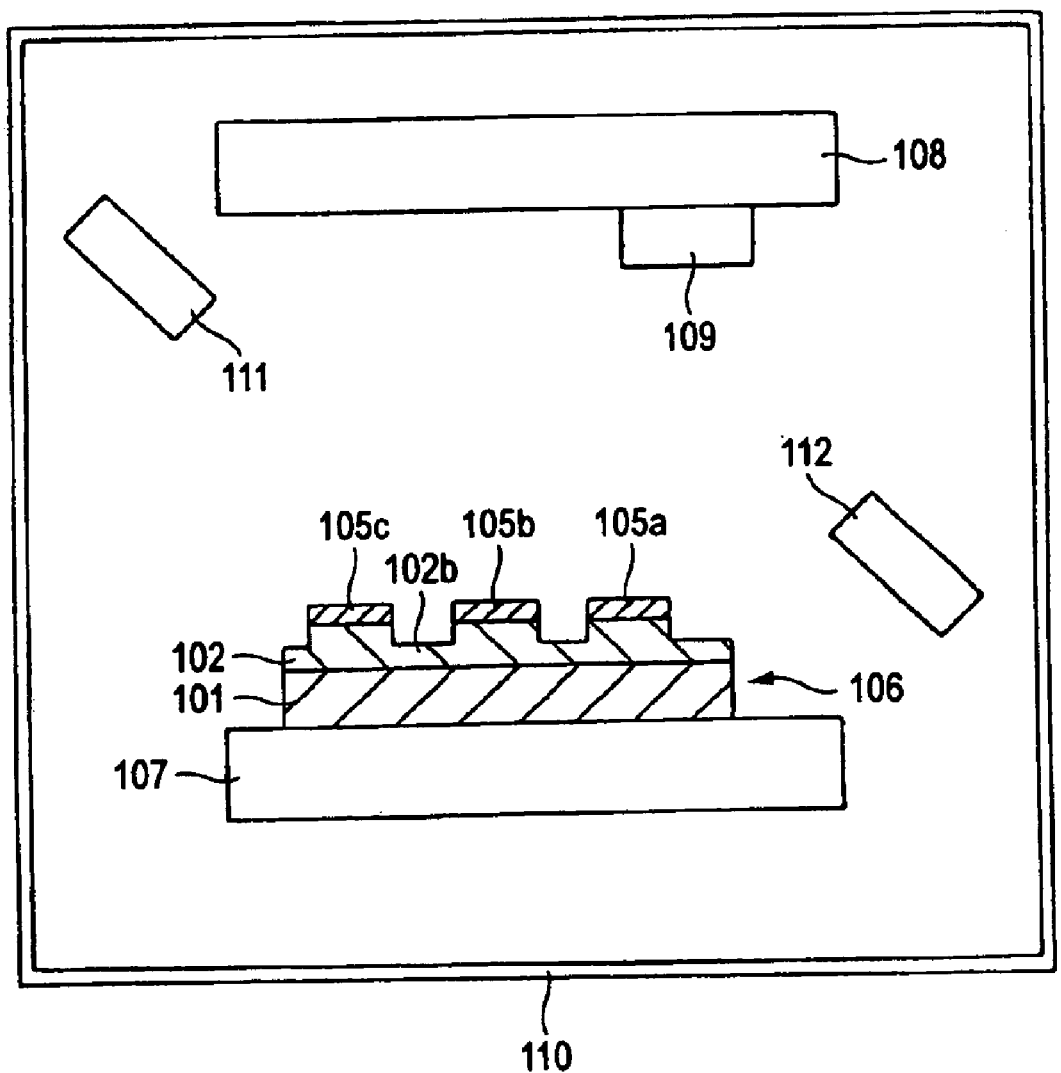
FIG. 2 shows the manufacturing method of a micro structure according to the first embodiment of the invention.

In the above-described manner, a donor substrate 106 shown in FIG. 1E is formed. In the next, transfer step, as shown in FIG. 2, the donor substrate 106 is fixed to an xyθ stage 107 that is provided in a vacuum chamber 110 and can be moved in the x-axis and y-axis directions and rotated about the z axis (i.e., in the θ direction). A target substrate 109 is fixed to a z stage 108 that can be moved in the z-axis direction. Then, FABs (fast atom beams) that are Ar neutral beams are emitted from particle beam emission ends 111 and 112 and applied to the surfaces of the donor substrate 106 on the xyθ stage 107 and the target substrate 109 on the z stage 108, whereby oxide films, impurities, etc. on the surfaces of the donor substrate 106 and the target substrate 109 are removed to produce clean surfaces.

Figure 3A:
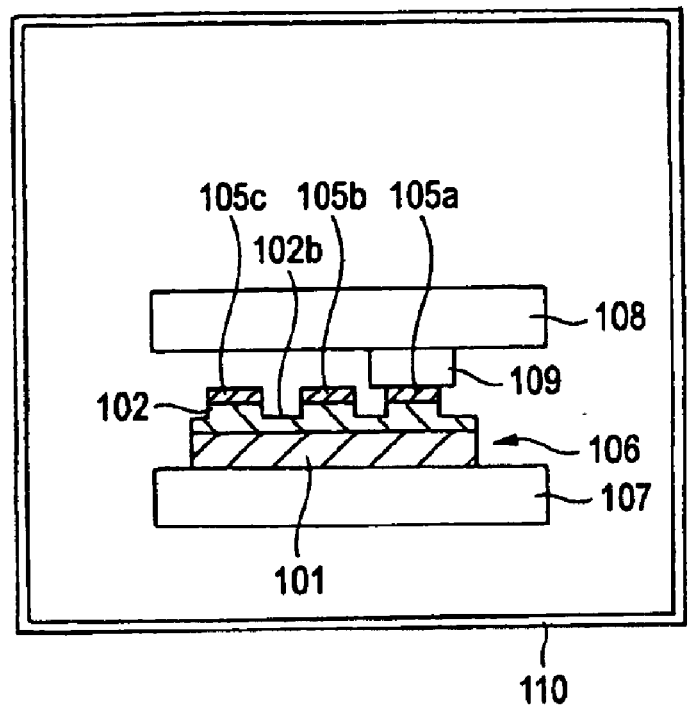
FIG. 3A shows the manufacturing method of a micro structure according to the first embodiment of the invention.
Figure 3B:
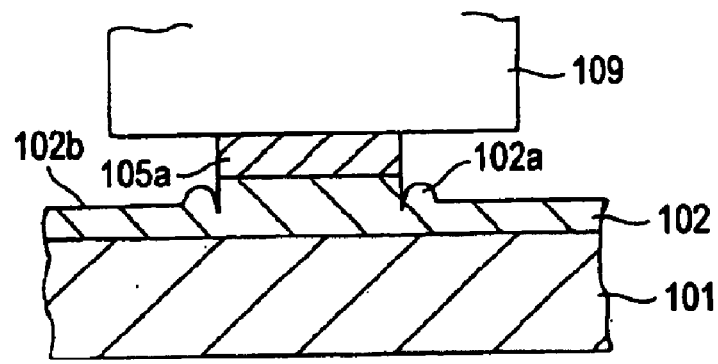
FIG. 3B is an enlarged view of part of FIG. 3A.

Subsequently, as shown in FIG. 3A, the surface of the target substrate 109 is brought into contact with the surface of the first thin-film pattern 105a and pressed against it with a load of 50 $kgf/cm^2$ for 5 minutes, whereby the target substrate 109 and the first thin-film pattern 105a are joined to each other strongly. Measured joining strength of 50 to 100 MPa is obtained in a tension test. FIG. 3B shows this state in detail. The recesses 102b are formed in the regions where the release layer 102 is exposed. Therefore, although a portion of the release layer 102 is raised in a region close to the circumference of the first thin-film pattern 105a in the transfer step, the raised portion 102a does not contact the target substrate 109.

Figure 4:
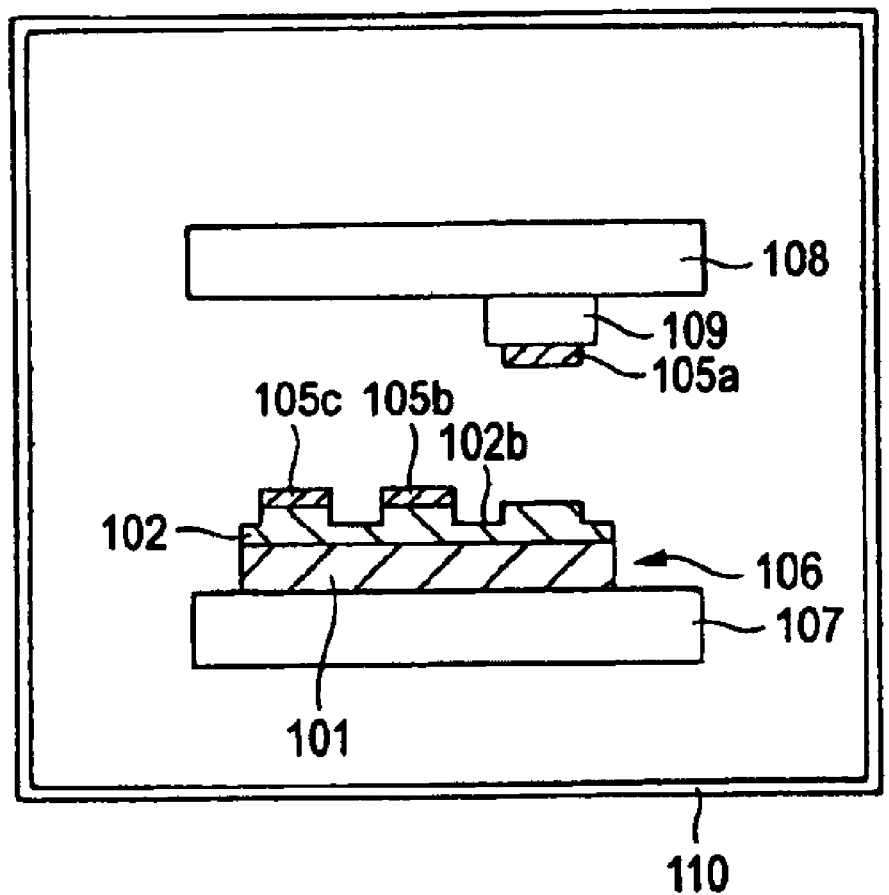
FIG. 4 shows the manufacturing method of a micro structure according to the first embodiment of the invention.
Figure 5A:
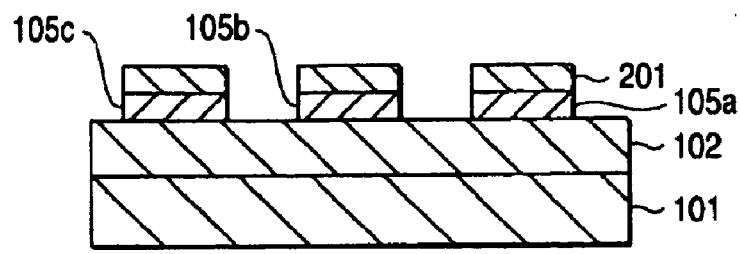
FIGS. 5A–5D are sectional views showing a manufacturing method of a micro structure according to a second embodiment of the invention.
Figure 5B:
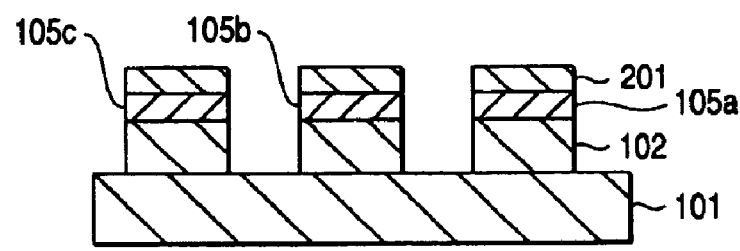
Figure 5C:
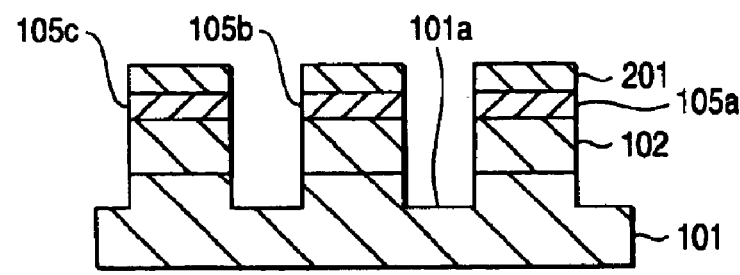
Figure 5D:
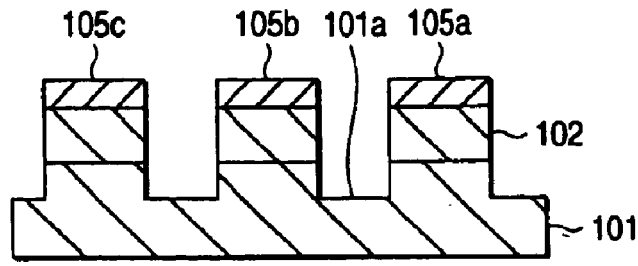
Figure 6A:
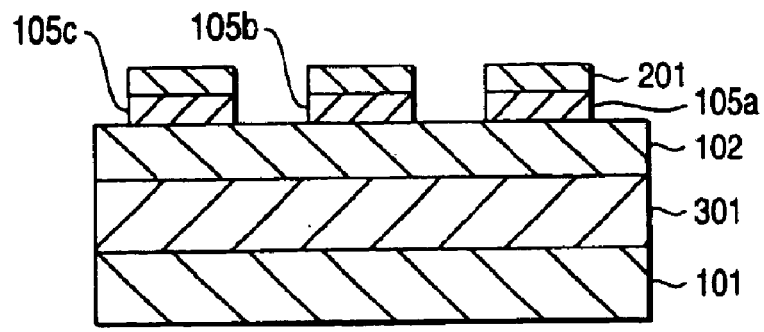
FIGS. 6A–6D are sectional views showing a manufacturing method of a micro structure according to a third embodiment of the invention.
Figure 6B:
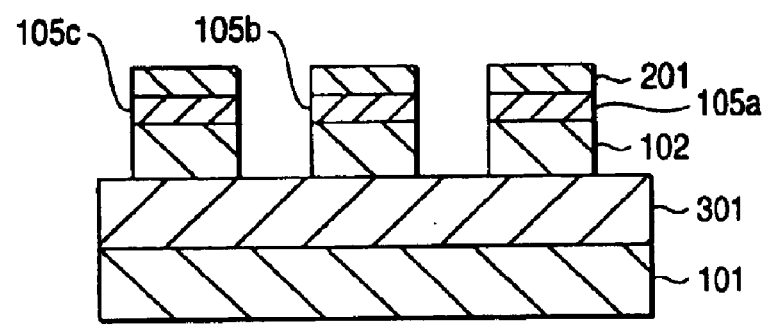
Figure 6C:
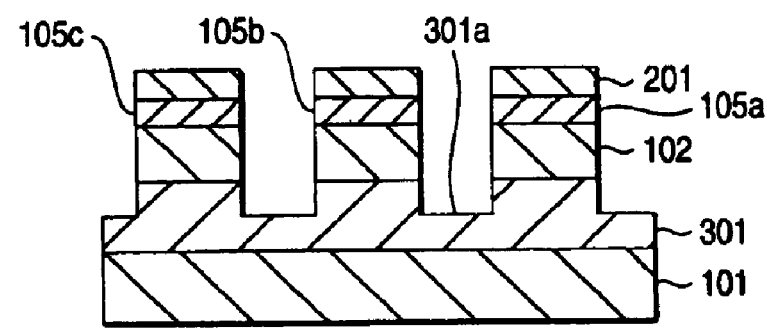
Figure 6D:
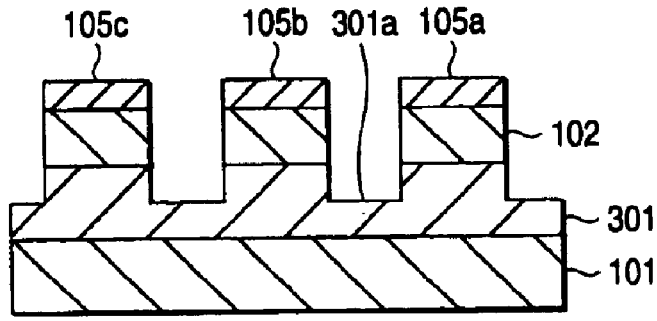
Figure 7A:
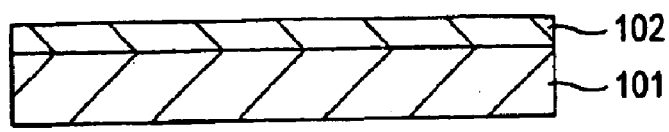
FIGS. 7A–7C, FIG. 8, and FIGS. 9A and 9B show conventional manufacturing methods of a micro structure.
Figure 7B:
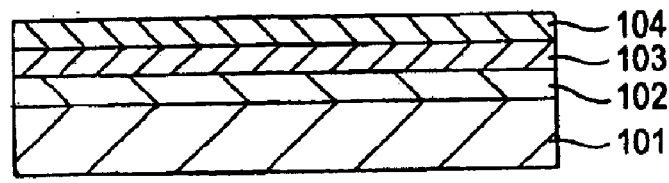
Figure 7C:
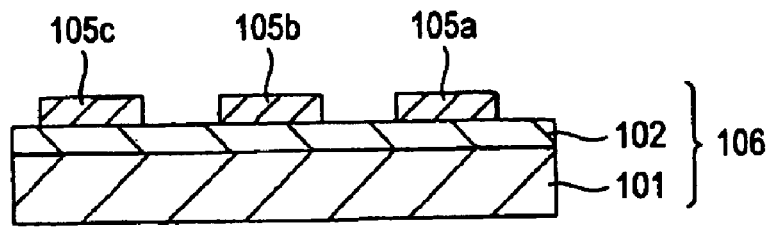
Figure 8:
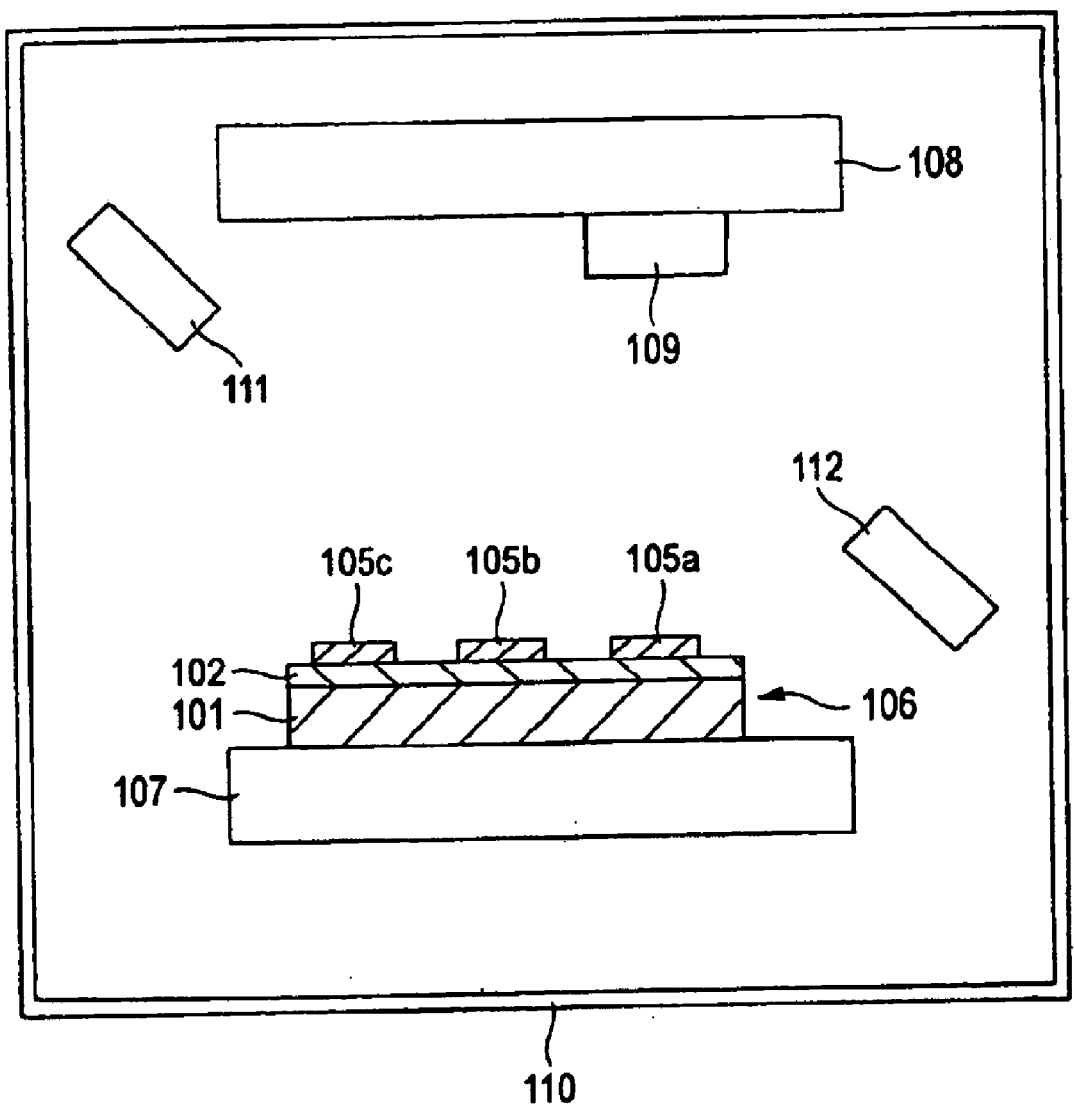
Figure 9A:
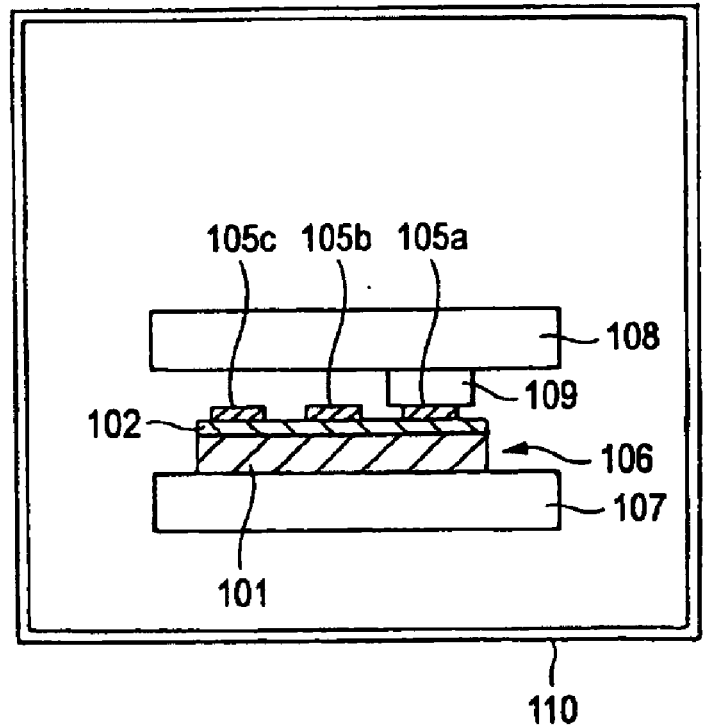
Figure 9B:
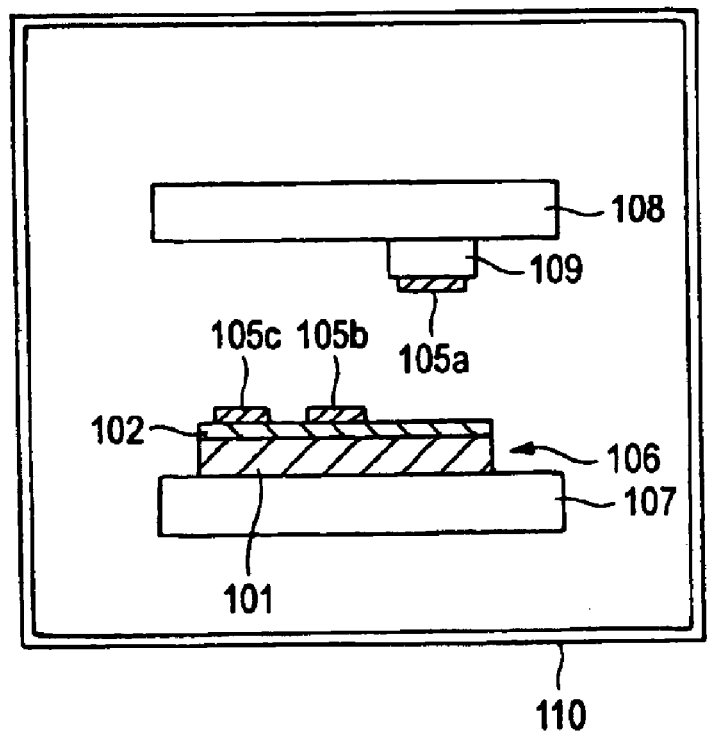
Figure 10:
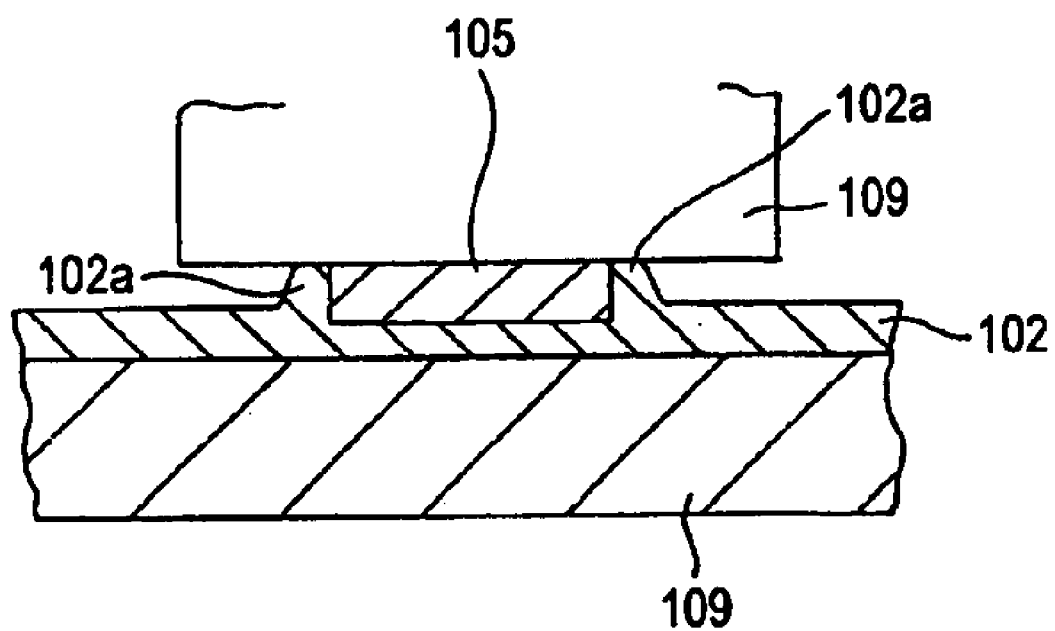
FIG. 10 is a sectional view illustrating a problem of the conventional manufacturing method.

Then, as shown in FIG. 4, the z stage 108 is elevated. Since the joining of the target substrate 109 and the first thin-film pattern 105a is stronger than the adhesion between the first thin-film pattern 105a and the release layer 102 on the donor substrate 106, the first thin-film pattern 105a is transferred from the donor substrate 106 to the target substrate 109.

Then, the xyθ stage 107 is moved by a prescribed pitch and positioning, FAB illumination, and transfer steps are repeatedly executed for the second thin-film pattern 105b and then for the third thin-film pattern 105c in the same manner as done for the first thin-film substrate 105a as shown in FIGS. 2, 3A and 4, whereby a micro structure is completed. FABs are applied to the surface of the thin-film pattern 105a or 105b that has been transferred to the target substrate 109 and the surface of the thin-film pattern 105b or 105c on the donor substrate 106 that will be transferred next. Then, the target substrate 109 is removed from the z stage 108 and the necessary micro structure is separated from the target substrate 109.

According to the first embodiment, since etch-back is performed in the regions where the release layer 102 is exposed, even if a portion of the release layer 102 is raised in the transfer step the raised portion 102a is prevented from contacting the target substrate 109 or the thin-film pattern 105a or 105b that has been transferred to the target substrate 109. Therefore, the thin-film patterns 105a, 105b, and 105c can be transferred in such a manner that a sufficient load is imposed there on reliably. This makes it possible to laminate thin films at a high transfer rate. Further, since a very thin film can be used, the resolution in the lamination direction can be increased. It is noted that etch-back may be performed only in regions close to the circumferences of the thin-film patterns 105a, 105b, and 105c instead of all the regions where the release layer 102 is exposed.

FIGS. 5A–5D show a manufacturing method of a micro structure according to a second embodiment of the invention. The second embodiment is such that after the release layer 102 is etched back to such an extent that its thickness becomes zero in the etching step of the first embodiment the substrate 101 is etched back to form recesses 101a therein. Where the substrate 101 is made of Si or $SiO_2$, $CF_4$ or the like suitable etching gas. The second embodiment is effective in a case that the height of the raised portions 102a of the release layer 102 is greater than the thickness of the thin-film patterns 105a, 105b, or 105c in the transfer step even if the release layer 102 is made thin. In such a case, by etching back the substrate 101, even if portions of the release layer 102 are projected laterally in the transfer step, the projected portions can be prevented from contacting the target substrate 109 or the thin-film pattern 105a or 105b that has been transferred to the target substrate 109. Therefore, a sufficient load can reliably be imposed on the thin-film patterns 105a, 105b, and 105c.

FIGS. 6A–6D show a manufacturing method of a micro structure according to a third embodiment of the invention. The third embodiment is different from the first embodiment in that an intermediate layer 301 is formed between the substrate 101 and the release layer 102 and that after the etch-back of the release layer 102 the intermediate layer 301 is etched back to form recesses 301a in the intermediate layer 301. Where the intermediate layer 301 is made of $SiO_2$, the etch-back can be performed by using such a gas as $CF_4$. According to the third embodiment, the use of the intermediate layer 301 that can be etched back more easily than the substrate 101 provides the same advantage as the second embodiment does. That is, even if portions of the release layer 102 are projected laterally in the transfer step, the projected portions can be prevented from contacting the target substrate 109 or the thin-film pattern 105a or 105b that has been transferred to the target substrate 109. Therefore, a sufficient load can reliably be imposed on the thin-film patterns 105a, 105b, and 105c.

The invention is not limited to the above embodiments and various modifications are possible. For example, the thin-film patterns may be made of a material other than Al, such as Cu, Ta, Ni, or Cr or an alloy thereof. The release layer may be made of a material other than polyimide, such as $SiO_2$, SiOF, or polyimide fluoride.

The depth of recesses that are formed by etch-back may be determined in accordance with parameters relating to the thin-film patterns such as their area, pitch, and circumferential length and parameters relating to the release layer such as its material and thickness. In this case, the following measure may be taken. The heights of raised portions are measured for various combinations of thin-film patterns and a release layer and measured values are stored in a judging device as statistical data. Whether etch-back is necessary is judged by inputting values of the above parameters to the judging device. If it is judged that etch-back is necessary, the judging device is caused to output an etch-back depth.

The thin-film patterns may be transferred directly to the stage or the like without using the counter substrate.

As described above, the invention may be implemented in the following specific manners:

(1) In the manufacturing method of a micro structure according to the invention, the etching-back step is executed on not only the release layer but also the substrate.

(2) The manufacturing method of a micro structure according to the invention further includes the step of forming an intermediate layer on the substrate before forming the release layer, wherein the etching-back step is executed on not only the release layer but also the intermediate layer.

(3) In the manufacturing method of a micro structure according to the invention, the etching-back step is executed by dry etching.

(4) In the manufacturing method of a micro structure according to the invention, in the etching-back step resist patterns on the thin-film patterns that are used in forming the thin-film patterns are etched together with the release layer.

(5) In the manufacturing method of a micro structure according to the invention, the etching-back step is executed by using the thin-film patterns as a mask.

(6) In the manufacturing method of a micro structure according to the invention, the prescribed depth is determined in accordance with parameters relating to the thin-film patterns including their area, pitch, and circumferential length and parameters relating to the release layer including its material and thickness.

The entire disclosure of Japanese Patent Application No. 2003-277815 filed on Jul. 22, 2003 including specification, claims, drawings and abstract is incorporated herein by reference in its entirety.

What is claimed is:

1. A manufacturing method of a micro structure comprising:
   forming a release layer on a substrate;
   forming a plurality of thin-film patterns that have prescribed two-dimensional patterns on the release layer;
   etching back the release layer at a prescribed depth at least in regions close to circumferences of the thin-film patterns; and
   transferring the thin-film patterns sequentially to a counter substrate so that they are laminated on the counter substrate and a micro structure is thereby formed;
   wherein a combination of the thin-film patterns and the release layer is such that when a prescribed pressure is applied to each of the thin-film patterns on the release layer in the transferring step, a height of a raised portion of the release layer that would be appeared in a region close to a circumference of the thin-film pattern if the release layer were not be etched back is greater than or equal to a thickness of the thin-film pattern.

2. The manufacturing method according to claim 1, wherein the etching-back step is executed on not only the release layer but also the substrate.

3. The manufacturing method according to claim 1, further comprising:

forming an intermediate layer on the substrate before forming the release layer;

wherein the etching-back step is executed on not only the release layer but also the intermediate layer.

4. The manufacturing method according to claim 1, wherein the etching-back step is executed by dry etching.

5. The manufacturing method according to claim 1, wherein in the etching-back step resist patterns on the thin-film patterns that are used in forming the thin-film patterns are etched together with the release layer.

6. The manufacturing method according to claim 1, wherein the etching-back step is executed by using the thin-film patterns as a mask.

7. The manufacturing method according to claim 1, wherein the prescribed depth is determined in accordance with parameters relating to the thin-film patterns including their area, pitch, and circumferential length and parameters relating to the release layer including its material and thickness.

* * * * *